United States Patent
Zhu (10) Patent No.: US 9,583,621 B2
(45) Date of Patent: Feb. 28, 2017

(54) SEMICONDUCTOR DEVICE AND METHOD OF MANUFACTURING THE SAME

(71) Applicant: Institute of Microelectronics, Chinese Academy of Sciences, Beijing (CN)

(72) Inventor: Huilong Zhu, Poughkeepsie, NY (US)

(73) Assignee: The Institute of Microelectronics of Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/797,767

(22) Filed: Jul. 13, 2015

(65) Prior Publication Data

US 2015/0318397 A1    Nov. 5, 2015

Related U.S. Application Data

(63) Continuation of application No. PCT/CN2013/071636, filed on Feb. 18, 2013.

(30) Foreign Application Priority Data

Jan. 15, 2013    (CN) .......................... 2013 1 0014886

(51) Int. Cl.
    *H01L 29/78*     (2006.01)
    *H01L 29/165*     (2006.01)
    (Continued)

(52) U.S. Cl.
    CPC ....... *H01L 29/7848* (2013.01); *H01L 21/0257* (2013.01); *H01L 21/02532* (2013.01);
    (Continued)

(58) Field of Classification Search
    CPC .............. H01L 21/823431; H01L 21/823821; H01L 27/0886; H01L 27/0924; H01L 27/10826; H01L 27/1211; H01L 29/66537; H01L 21/0257; H01L 21/3083; H01L 29/0638; H01L 29/1083; H01L 29/165; H01L 29/7848; H01L 29/7851; H01L 29/66795
    (Continued)

(56) References Cited

U.S. PATENT DOCUMENTS

| 2009/0267155 | A1* | 10/2009 | Izumida ............... H01L 29/1054 257/365 |
| 2011/0068401 | A1 | 3/2011 | Izumida et al. |
| 2013/0280883 | A1* | 10/2013 | Faul .................. H01L 29/66803 438/434 |

FOREIGN PATENT DOCUMENTS

| CN | 1077569 A | 10/1993 |
| CN | 102104069 A | 6/2011 |

OTHER PUBLICATIONS

International Search Report for International Application No. PCT/CN2013/071636 mailed Oct. 24, 2013 from the State Intellectual Property Office of the P.R. China, 4 pages.

(Continued)

*Primary Examiner* — Jarrett Stark
*Assistant Examiner* — Shahed Ahmed
(74) *Attorney, Agent, or Firm* — BainwoodHuang (57) ABSTRACT

Provided are a semiconductor device and a method of manufacturing the same. An example device may include: a fin formed on a substrate; a gate stack formed on the substrate and intersecting the fin, wherein the gate stack is isolated from the substrate by an isolation layer, and a Punch-Through Stopper (PTS) formed under the fin, including a first section directly under a portion of the fin where the fin intersects the gate stack and second sections on opposite sides of the first section, wherein the second sections each have a doping concentration lower than that of the first section.

6 Claims, 9 Drawing Sheets

(51) Int. Cl.

| | |
|---|---|
| *H01L 29/66* | (2006.01) |
| *H01L 21/265* | (2006.01) |
| *H01L 29/10* | (2006.01) |
| *H01L 29/06* | (2006.01) |
| *H01L 21/308* | (2006.01) |
| *H01L 21/02* | (2006.01) |
| *H01L 21/8234* | (2006.01) |
| *H01L 27/088* | (2006.01) |

(52) U.S. Cl.
CPC .... *H01L 21/26513* (2013.01); *H01L 21/3083* (2013.01); *H01L 21/823431* (2013.01); *H01L 27/0886* (2013.01); *H01L 29/0638* (2013.01); *H01L 29/1083* (2013.01); *H01L 29/165* (2013.01); *H01L 29/6681* (2013.01); *H01L 29/66545* (2013.01); *H01L 29/66795* (2013.01); *H01L 29/7851* (2013.01)

(58) Field of Classification Search
USPC ......... 257/288, 368, 269; 438/151, 197, 199
See application file for complete search history.

(56) References Cited

OTHER PUBLICATIONS

Okano, K. et al., "Process Integration Technology and Device Characteristics of CMOS FinFET on Bulk Silicon Substrate with sub-10 nm Fin Width and 20 nm Gate Length", Electron Device Meeting, 2005, IEDM Technical Digest, IEEE International, Dec. 5, 2005, pp. 721-724.

Venugopalan, S. et al., "Compact Models for Real Device Effect in FinFETs", SISPAD 2012, Sep. 7, 2012, pp. 292-295.

K. Okano, et al., "Process Integration Technology and Device Characteristics of CMOS FinFET on Bulk Silicon Substrate with sub-10 nm Fin Width and 20 nm Gate Length", 0-7803-9269-8/05, IEEE, 2005, pp. 721-724.

S. Venugopalan, et al., "Compact Models for Real Device Effects in FinFETs", SISPAD 2012, ISBN 978-0-615-71756-2, pp. 292-295.

Chinese Office Action dated Mar. 3, 2016 for corresponding Chinese patent application 201310014886.0, including its English translation.

\* cited by examiner

SEMICONDUCTOR DEVICE AND METHOD OF MANUFACTURING THE SAME

CROSS-REFERENCE TO RELATED APPLICATION

This application is a U.S. national phase application of PCT Application No. PCT/CN2013/071636 filed on Feb. 18, 2013, entitled "Semiconductor Device and Method of Manufacturing the Same," which claimed priority to Chinese Patent Application No. 201310014886.0, filed on Jan. 15, 2013. Both the PCT Application and the Chinese Application are incorporated herein by reference in their entireties.

TECHNICAL FIELD

The present disclosure relates to the semiconductor technology, and particularly to semiconductor devices and methods of manufacturing the same.

BACKGROUND

Short channel effects are getting more significant as planar semiconductor devices are increasingly scaled down. To this end, three-dimensional (3D) semiconductor devices, such as Fin Field Effect Transistors (FinFETs), have been proposed. Generally, a FinFET includes a fin formed vertically on a substrate and a gate stack intersecting the fin. In addition, an isolation layer is formed on the substrate to isolate the gate stack from the substrate. As such, the fin has its bottom surrounded by the isolation layer. Therefore, it is difficult for the gate to effectively control the bottom of the fin. As a result, a leakage current tends to occur between a source and a drain via the bottom of the fin.

Generally, a Punch-Through Stopper (PTS) can be used to suppress the leakage current. However, introduction of such a PTS increases junction leakage and junction capacitance.

SUMMARY OF THE DISCLOSURE

The present disclosure aims to provide, among others, a semiconductor device and a method of manufacturing the same.

According to an aspect of the present disclosure, there is provided a method of manufacturing a semiconductor device, comprising: forming a fin structure on a substrate; forming an isolation layer on the substrate, wherein the isolation layer exposes a portion of the fin structure, which serves as a fin for the semiconductor device; performing first ion implantation to form a Punch-Through Stopper (PTS) under the fin; forming a gate stack intersecting the fin structure on the isolation layer; and performing second ion implantation to compensate for the PTS.

According to another aspect of the present disclosure, there is provided a semiconductor device, comprising: a fin formed on a substrate; a gate stack formed on the substrate and intersecting the fin, wherein the gate stack is isolated from the substrate by an isolation layer, and a Punch-Through Stopper (PTS) formed under the fin, including a first section directly under a portion of the fin where the fin intersects the gate stack and second sections on opposite sides of the first section, wherein the second sections each have a doping concentration lower than that of the first section.

According to embodiments of the present disclosure, the PTS is formed under the fin. By means of the first ion implantation and the second implantation as described above, the first section of the PTS whose doping concentration is relatively high is self-aligned to and directly under a channel region, and thus it is possible to effectively reduce leakage between source and drain. Further, the second sections of the PTS whose doping concentration is relatively low are self-aligned to and directly under the source and drain, and thus it is possible to reduce a junction capacitance between the source/drain and the substrate.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Hereinafter, the technology disclosed herein is described with reference to embodiments thereof shown in the attached drawings. However, it should be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, there is provided a semiconductor device. The semiconductor device may comprise a substrate, a fin formed on the substrate, and a gate stack formed on the substrate and intersecting the fin. The gate stack may be isolated from the substrate by an isolation layer.

To suppress leakage between source and drain via the bottom of the fin, the semiconductor device may comprise a Punch-Through Stopper (PTS) formed under the fin. Further, while suppressing the leakage, to reduce a junction capacitance and junction leakage between the source/drain and the substrate, the PTS may include a first section whose doping concentration is relatively high positioned directly under a channel region, and also second sections whose doping concentration is relatively low positioned directly under the source and the drain, respectively. Such a PTS may be formed by the self-aligned technology disclosed herein.

According to an embodiment of the present disclosure, the self-aligned technology can be implemented as follows.

For example, a fin structure may be formed on a substrate, and then an isolation layer may be formed on the substrate to expose a portion of the fin structure (the exposed portion of the fin structure will serve as a real fin for the final device). After that, first ion implantation may be performed to form a PTS under the fin. Then, a gate stack (including, for example, a gate dielectric layer, a gate conductor layer, and a gate spacer) may be formed on the isolation layer. The gate stack intersects the fin, and thus defines a channel region and also source and drain regions in the fin (specifically, a portion of the fin where the fin intersects the gate stack may have the channel region formed therein, and portions of the fin on opposite sides of the channel region may constitute the source and drain regions). Next, second ion implantation may be performed. Due to the presence of the gate stack, the second ion implantation mostly enters regions directly under the source and drain regions, but substantially not entering the region directly under the channel region. The second ion implantation may have a dopant type opposite to that of the first ion implantation, and thus compensate for sections of the PTS directly under the source and drain regions (by, for example, reducing the doping concentration thereof). As a result, the PTS includes a first section whose doping concentration is relatively high (and is basically determined by the first ion implantation) and second sections on opposite sides of the first section (whose doping concentration is basically determined by a combination of effects of both the first ion implantation and the second ion implantation). Due to the gate stack, the first section is self-aligned to and directly under the gate stack (or the channel region), and the second sections are self-aligned to and directly under the source and drain, respectively.

According other embodiments of the present disclosure, the strained source/drain technology is also applicable. For example, after the gate stack is formed, the fin structure may be selectively etched with the gate stack as a mask. Then, a semiconductor layer may be epitaxially grown to form source and drain regions. Such source and drain regions can apply stress (compressive stress for a p-type device, or tensile stress for an n-type device) to the channel region, to improve device performances.

According to other embodiments of the present disclosure, the replacement gate process may be incorporated. For example, the gate state formed as above is a sacrificial gate stack (including, for example, a sacrificial gate dielectric layer, a sacrificial gate conductor layer, and a gate spacer). According to the replacement gate process, after source/drain implantation (or alternatively, after source/drain growth in a case where the strained source/drain technology is applied as described above), the sacrificial gate conductor layer and the sacrificial gate dielectric layer may be selectively removed, to form a gate trench (or hole) on inner sides of the gate spacer. Then, a gate dielectric layer (for example, a high-K gate dielectric) and a gate conductor (for example, a metal gate conductor) may be formed in the gate trench (or hole), to form a real gate stack for the device.

The present disclosure may be presented in various forms, and some examples thereof will be described hereafter.

Figure 1:
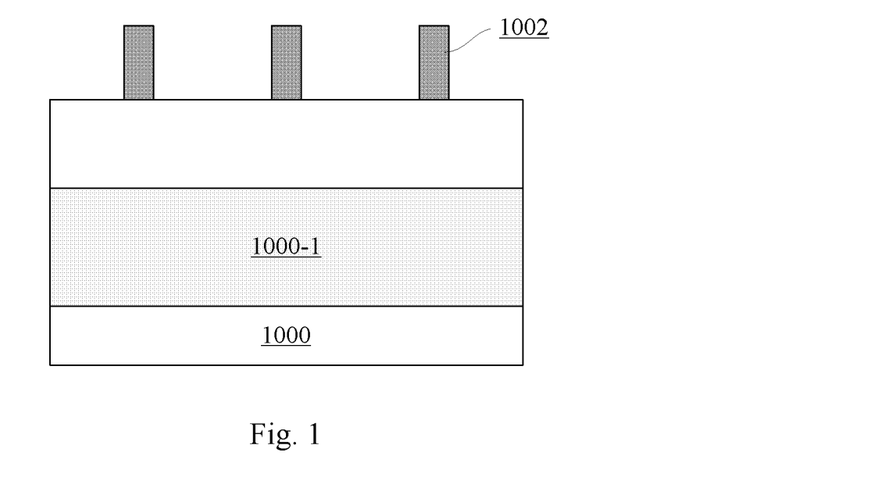
FIGS. 1 to 12 are schematic views showing a flow for manufacturing a semiconductor device according to an embodiment of the present disclosure.

As shown in FIG. 1, a substrate 1000 is provided. The substrate 1000 may comprise any suitable substrate in various forms, for example, but not limited to, bulk semiconductor substrate such as bulk Si substrate, Semiconductor On Insulator (SOI) substrate, compound semiconductor substrate such as SiGe substrate, or the like. In the following, a bulk Si substrate is described by way of example for convenience of description.

In some examples of the present disclosure, a well 1000-1 may be formed in the substrate 1000. For example, an n-type well may be formed for a p-type device, or a p-type well may be formed for an n-type device. For example, the n-type well may be formed by implanting n-type impurities such as P or As into the substrate 1000, and the p-type well may be formed by implanting p-type impurities such as B into the substrate 1000. If required, annealing may be performed after the implantation. To those skilled in the art, the n-type or p-type well may be formed in various ways, and detailed descriptions thereof will be omitted here.

Figure 2:
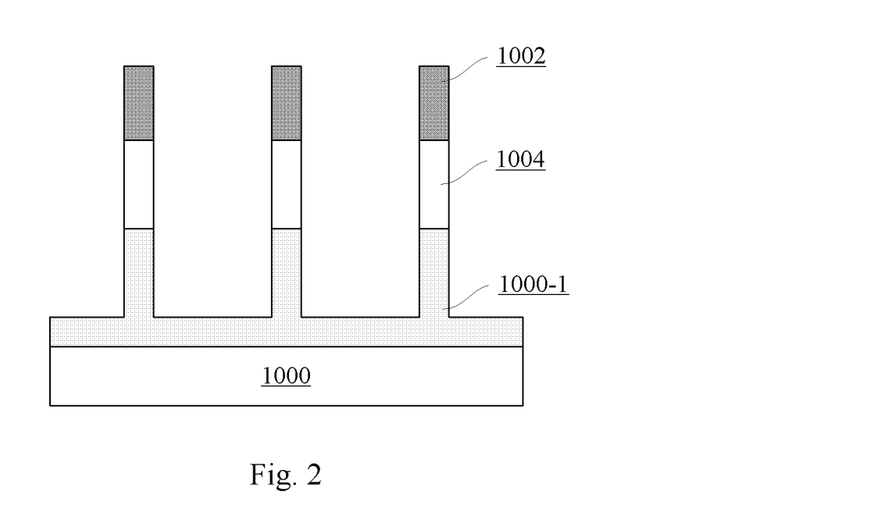

Next, the substrate 1000 may be patterned to form fin structures thereon. For example, this may be done as follows. Specifically, patterned photoresist 1002 may be formed on the substrate 1000 according to the design. The photoresist 1002 is typically patterned into a series of parallel, equally spaced lines. Subsequently, as shown in FIG. 2, the substrate 1000 may be etched by, e.g., Reactive Ion Etching (RIE), with the patterned photoresist 1002 as a mask, in order to form the fin structures 1004. Here, the etching of the substrate 1000 can be done into the well section 1000-1. Then, the photoresist 1002 may be removed.

It should be noted that the shape of trenches (between the fin structures 1004) formed by the etching is not necessarily a regular rectangle as shown in FIG. 2, but may be tapered from top down. Further, positions and the number of the fin structures formed are not limited to the example as shown in FIG. 2.

Furthermore, the fin structures are not limited to being formed by directly patterning the substrate. For example, the fin structures may be formed by epitaxially growing another semiconductor layer on the substrate and then patterning the other semiconductor layer. If there is sufficient etching selectivity between the other semiconductor layer and the substrate, the patterning of the fin structures may be stopped at the substrate, so as to implement a more precise control on the height of the fin structures.

Therefore, in the context of the present disclosure, the expression "forming a fin structure on a substrate" may comprise forming the fin structure on the substrate in any suitable manner.

Figure 3:
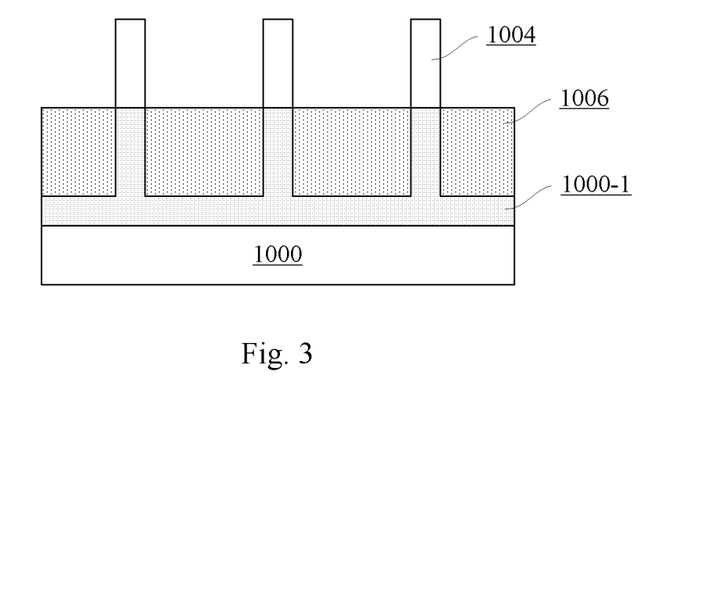

After the fin structures are formed by the above processes, an isolation layer may be formed on the substrate. For example, as shown in FIG. 3, a dielectric layer (comprising, for example, oxide such as silicon oxide) may be formed on the substrate by e.g. deposition, and then etched back to form the isolation layer 1006. Generally, the deposited dielectric layer can fully cover the fin structures 1004, and may be planarized by, for example, Chemical Mechanical Polishing (CMP) before the back-etching. Preferably, the dielectric layer may be subjected to sputtering so as to be planarized. For example, plasma such as Ar or N plasma may be used for sputtering. In the case where the well 1000-1 is formed in the substrate 1000, the isolation layer 1006 preferably exposes the well slightly. That is, the isolation layer 1006 has its top surface slightly lower than that of the well 1000-1 (a height difference thereof is not shown in the drawings).

Figure 4:
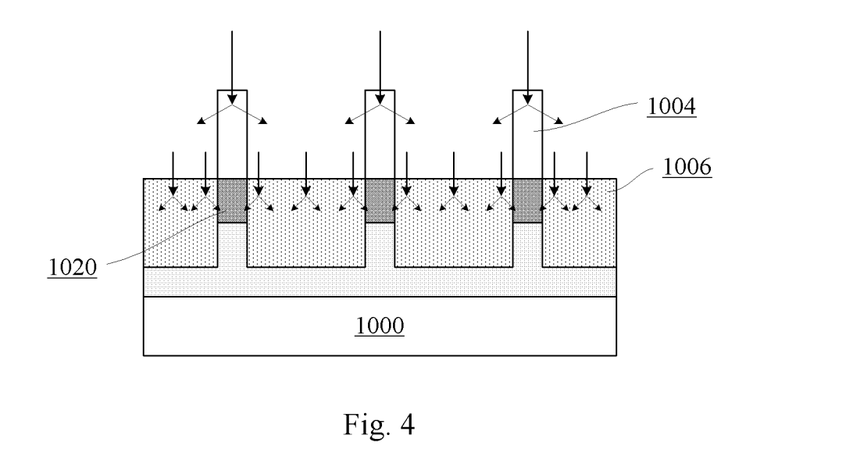

According to an embodiment of the present disclosure, to improve the device performances, especially, to reduced leakage between source and drain, a punch-through stopper (PTS) 1020 may be formed by implantation (referred to as "first ion implantation" hereinafter) as shown by arrows in FIG. 4. For example, p-type impurities such as B, $BF_2$ or In may be implanted for an n-type device; and n-type impurities such as As or P may be implanted for a p-type device. The first ion implantation may be carried out in a direction substantially perpendicular to the surface of the substrate. Parameters for the first ion implantation may be controlled, so that the PTS may be formed in a portion of the fin structure 1004 which is located below the surface of the isolation layer 1006 and may have a desired doping concentration, for example, about 5E17-2E19 $cm^{-3}$, which should be higher than that of the well 1000-1 in the substrate. It should be noted that a part of dopants (ions or elements) may be scattered from the exposed portions of the fin structures due to a form factor of the fin structures 1004 (which is elongated). Thus, it is beneficial to form an abrupt doping distribution in a depth direction. Annealing, such as spike annealing, laser annealing, and/or rapid annealing, may be performed to activate the implanted dopants. Such a PTS may facilitate to reduce leakage between the source and the drain.

Figure 5:
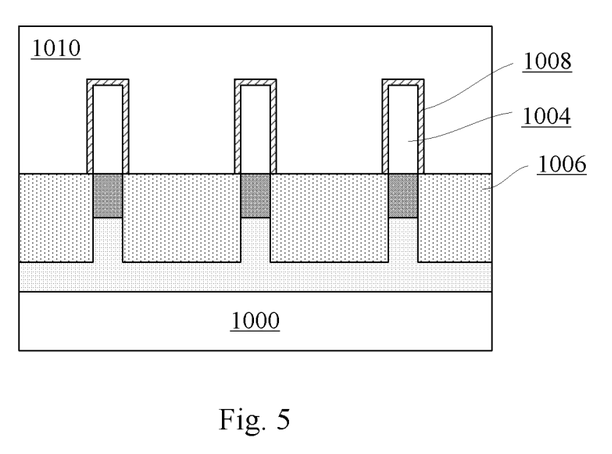

Next, a gate stack intersecting the fins may be formed on the isolation layer 1006. For example, this can be done as follows. Specifically, as shown in FIG. 5, a gate dielectric layer 1008 may be formed by e.g. deposition. For example, the gate dielectric layer 1008 may comprise oxide with a thickness of about 0.8-1.5 nm. In the example as shown in FIG. 5, the gate dielectric layer 1008 is shown in a "Π" shape. However, the gate dielectric layer 1008 may also include a portion extending on the top surface of the isolation layer 1006. Then, a gate conductor layer 1010 may be formed by e.g. deposition. For example, the gate conductor layer 1010 may comprise polysilicon. The gate conductor layer 1010 may fill the gaps between the fins, and then planarized by, for example, CMP.

Figure 6:
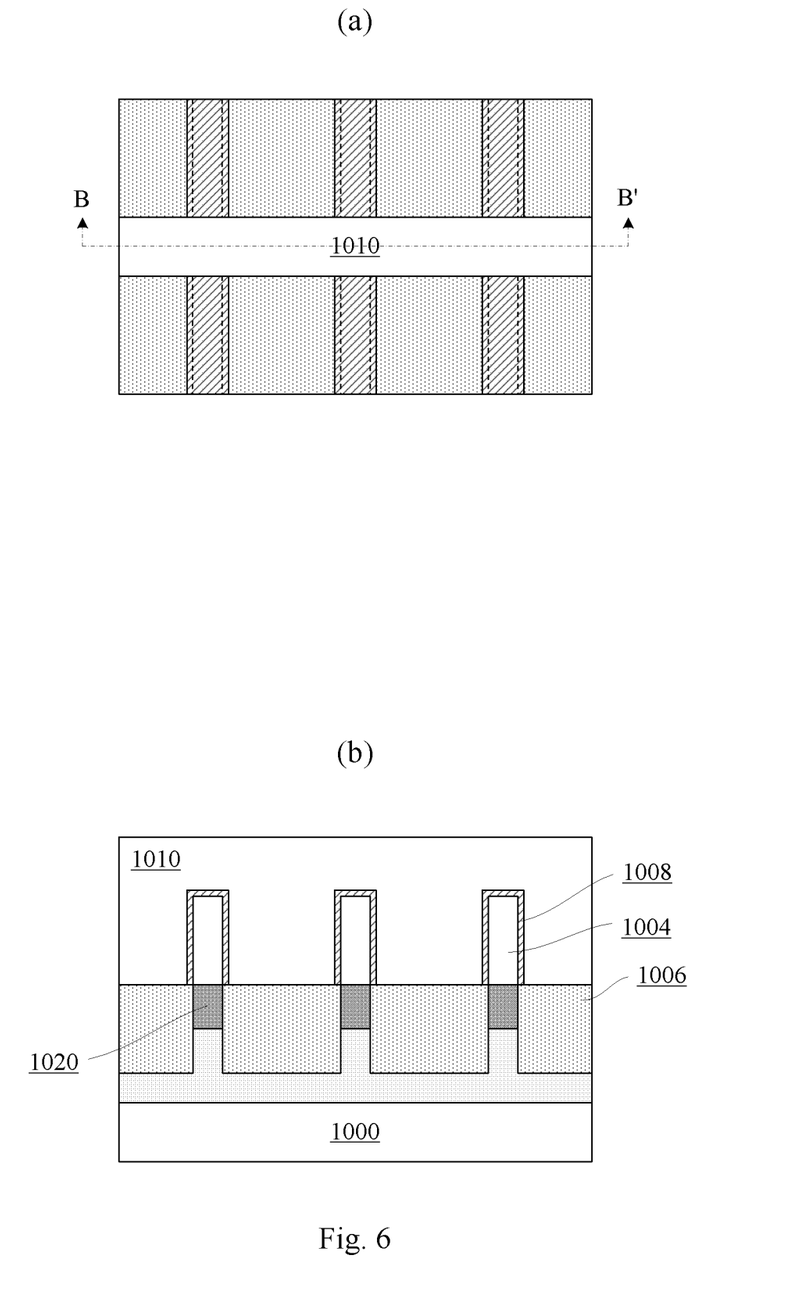

Then, as shown in FIG. 6 (FIG. 6(b) shows a cross-sectional view along line BB' in FIG. 6(a)), the gate conductor layer 1010 may be patterned. In the example of FIG. 6, the gate conductor layer 1010 is patterned into a bar intersecting the fin structures. According to another embodiment, the gate dielectric layer 1008 may be further patterned with the patterned gate conductor layer 1010 as a mask.

After the gate conductor is patterned, halo implantation and extension implantation may be carried out with the gate conductor as a mask.

Figure 7:
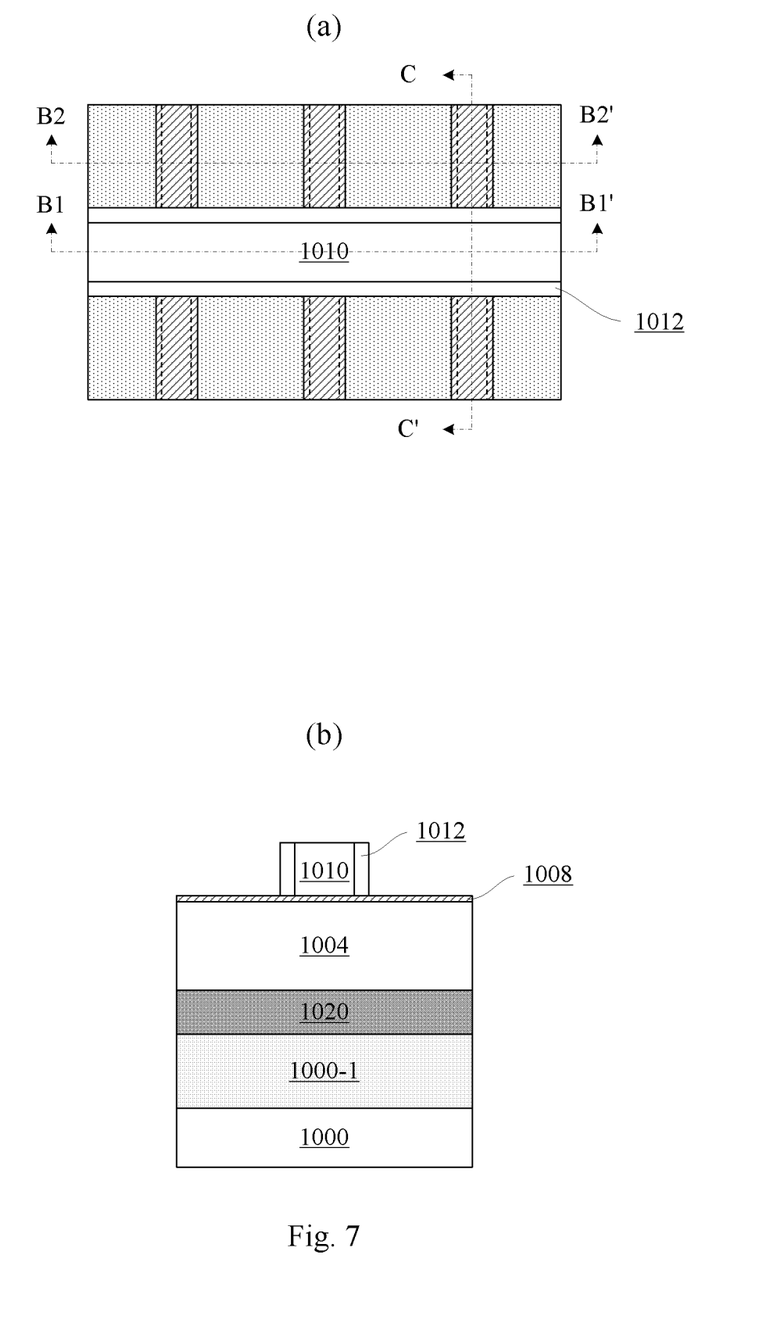

Next, as shown in FIG. 7 (FIG. 7(b) shows a cross-sectional view along line CC' in FIG. 7(a)), a gate spacer 1012 may be formed on sidewalls of the gate conductor layer 1010. For example, nitride such as silicon nitride with a thickness of about 5-20 nm may be formed by deposition, and then subjected to RIE to form the gate spacer 1012. There are various methods to form the gate spacer, and detailed descriptions thereof are omitted here. When the trenches between the fin structures are tapered from top down (which is a common situation due to characteristics of etching), the spacer 1012 may have substantially no portion formed on sidewalls of the fin structures.

Figure 8:
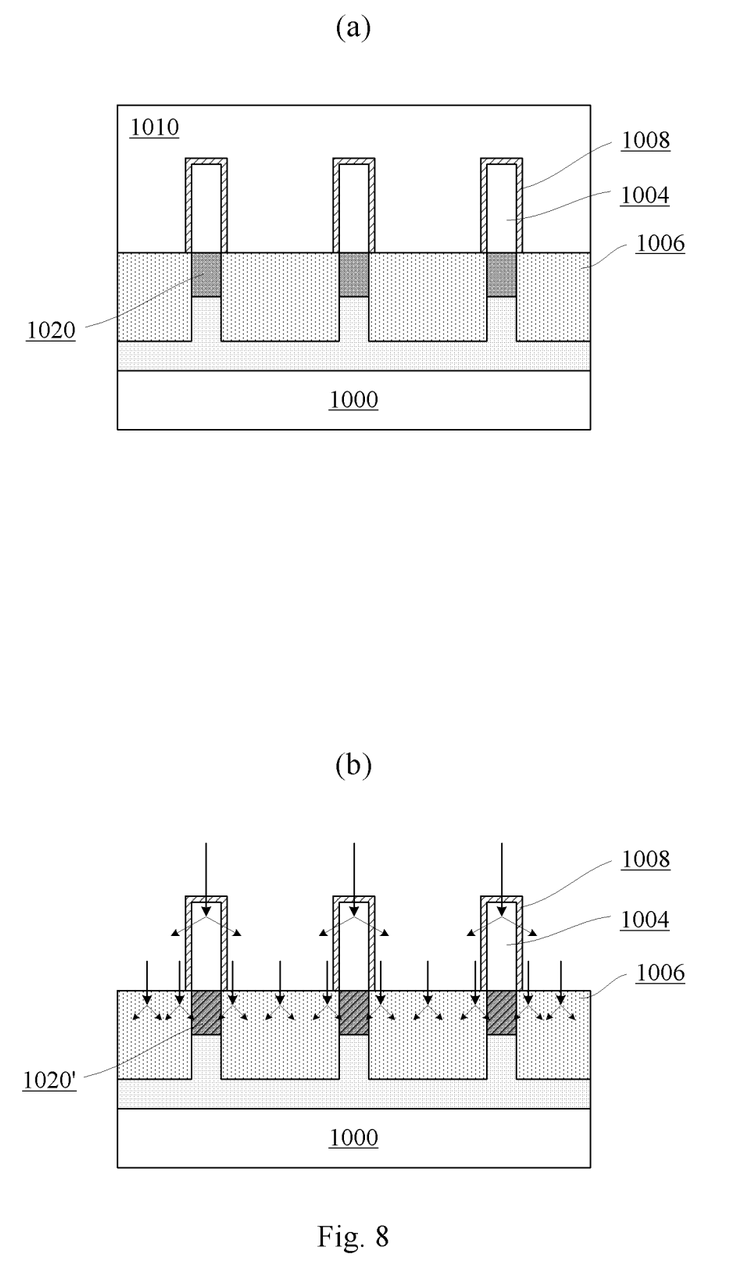
Figure 8C:
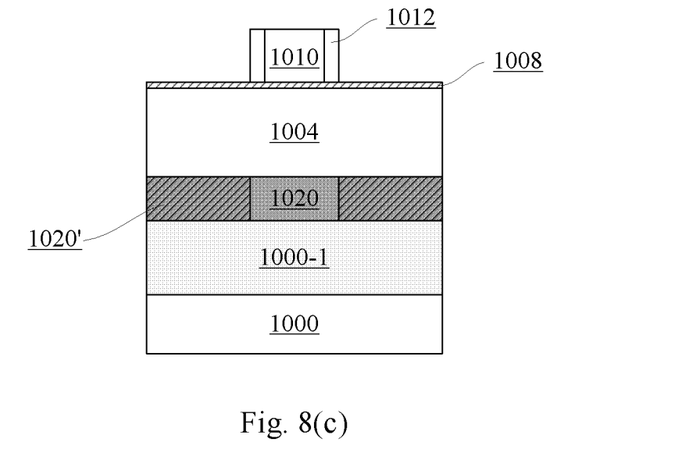

According to an embodiment of the present disclosure, to improve the device performances, especially to reduce a junction capacitance between the source/drain and the substrate, sections of the PTS directly under the source/drain regions may be compensated for after the gate stack (including the gate dielectric layer, the gate conductor layer, and the gate spacer, for example) is formed as described above. For example, as shown by arrows in FIG. 8 (FIG. 8(a) shows a cross-sectional view along line B1B1' in FIG. 7(a), FIG. 8(b) shows a cross-sectional view along line B2B2' in FIG. 7(a), and FIG. 8(c) shows a cross-sectional view along line CC' in FIG. 7(a)), ion implantation (referred to as "second ion implantation" hereinafter) may be performed, to reduce the doping concentration of the PTS 1020. Specifically, the conductivity type of dopants used in the second ion implantation is opposite to that of dopants used in the first ion implantation. For example, for an n-type device, the second ion implantation may use n-type dopants such as As or P because the first ion implantation uses p-type dopants; for a p-type device, the second ion implantation may use p-type dopants such as B, $BF_2$ or In because the first ion implantation uses n-type dopants. The second ion implantation may be carried out in a direction substantially perpendicular to the surface of the substrate. Parameters for the second ion implantation may be controlled, so that it enters the PTS 1020 to effectively compensate for the PTS 1020, to, for example, reduce the doping concentration of the PTS to about 5E16-1E19 $cm^{-3}$.

As shown in FIG. 8(a), due to the presence of the gate stack, the second ion implantation has substantially no impact on regions directly under portions of the respective fin structures 1004 where the fin structures 1004 intersect the gate stack (in which channel regions are to be formed). In contrast, as shown in FIG. 8(b), in regions directly under portions of the respective fin structures 1004 on opposite sides of the gate stack, it is possible to form an abrupt doping distribution due to the form factor of the fin structures 1004 (which is elongated), like the first ion implantation. As a result, as shown in FIG. 8(c), a section of the PTS 1020 directly under the gate stack maintains substantially the original doping concentration, while remaining sections thereof have the doping concentration reduced (indicated as 1020' in FIG. 8(c)). The arrangement of the section 1020 whose doping concentration is relatively high and the sections 1020' whose doping concentration is relatively low is determined by the gate stack (including the gate dielectric layer 1008, the gate conductor layer 1010, and the gate spacer 1012, for example). Therefore, the section 1020 whose doping concentration is relatively high is self-aligned to and directly under the channel region, and the sections 1020' whose doping concentration is relatively low are self-aligned to and directly under the source/drain regions, respectively.

After the spacer is formed, source/drain (S/D) implantation may be performed with the gate conductor and the gate spacer as a mask. Subsequently, annealing may be performed to activate implanted ions to form the source/drain regions, resulting in FinFETs.

Figure 9:
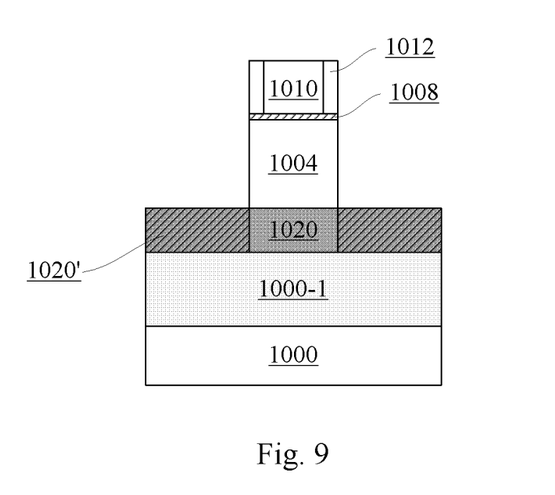

To improve the device performances, the strained source/drain technology can be applied according to an embodiment of the present disclosure. Specifically, as shown in FIG. 9, exposed portions of the gate dielectric layer 1008 may be selectively removed (by e.g. RIE). In a case where both the gate dielectric layer 1008 and the isolation layer 1006 comprise oxide, the RIE of the gate dielectric layer 1008 may have substantially no impact on the isolation layer 1006 because the gate dielectric layer 1008 is relatively thin. This operation is not required any more if the gate dielectric layer has been further patterned with the gate conductor as a mask in the process of forming the gate stack as described above.

Then, portions of the fin structures 1004 which are exposed due to the removal of the gate dielectric layer 1008 may be selectively removed (by e.g. RIE). The etching of those portions of the fin structures 1004 may be carried out to reach the well 1000-1. Due to the presence of the gate stack, a portion of the fin structure 1004 may be left directly under the gate stack. It is to be noted that the fin structure 1004 after being etched is shown in FIG. 9 to have its edges aligned with those of the gate spacer 1012, but the present disclosure is not limited thereto. For example, the edges of the fin structure 1004 may be recessed inward with respect to the respective edges of the gate spacer 1012 due to lateral effects (which might be small) of the etching.

Figure 10:
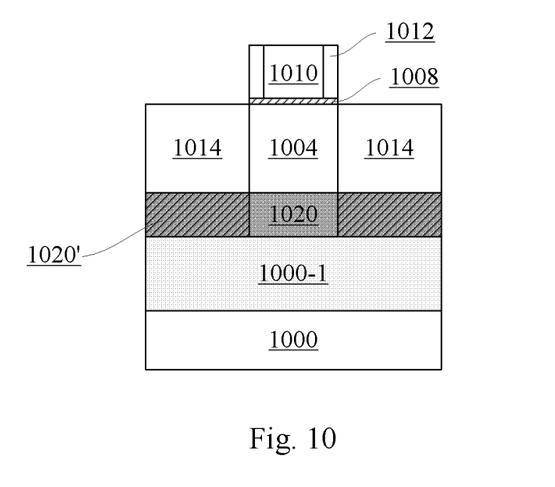

Subsequently, as shown in FIG. 10, a semiconductor layer 1014 may be formed on exposed portions of the fin structures by e.g. epitaxy. Then, source/drain regions may be formed in the semiconductor layer 1014. According to an embodiment of the present disclosure, the semiconductor layer 1014 may be doped in-situ while being grown. For example, n-type in-situ doping may be performed for an n-type device; while p-type in-situ doping may be performed for a p-type device. Moreover, in order to further improve the performances, the semiconductor layer 1014 may comprise a material different from that of the fin structure 1004 to apply stress to the fin structure 1004 (in which a channel of the device will be formed). For example, in a case where the fin structure 1004 comprises Si, the semiconductor layer 1014 may comprise Si:C (where an atomic percentage of C is e.g. about 0.2-2%) to apply tensile stress for the n-type device, or SiGe (where an atomic percentage of Ge is e.g. about 15-75%) to apply compressive stress for the p-type device.

Figure 11:
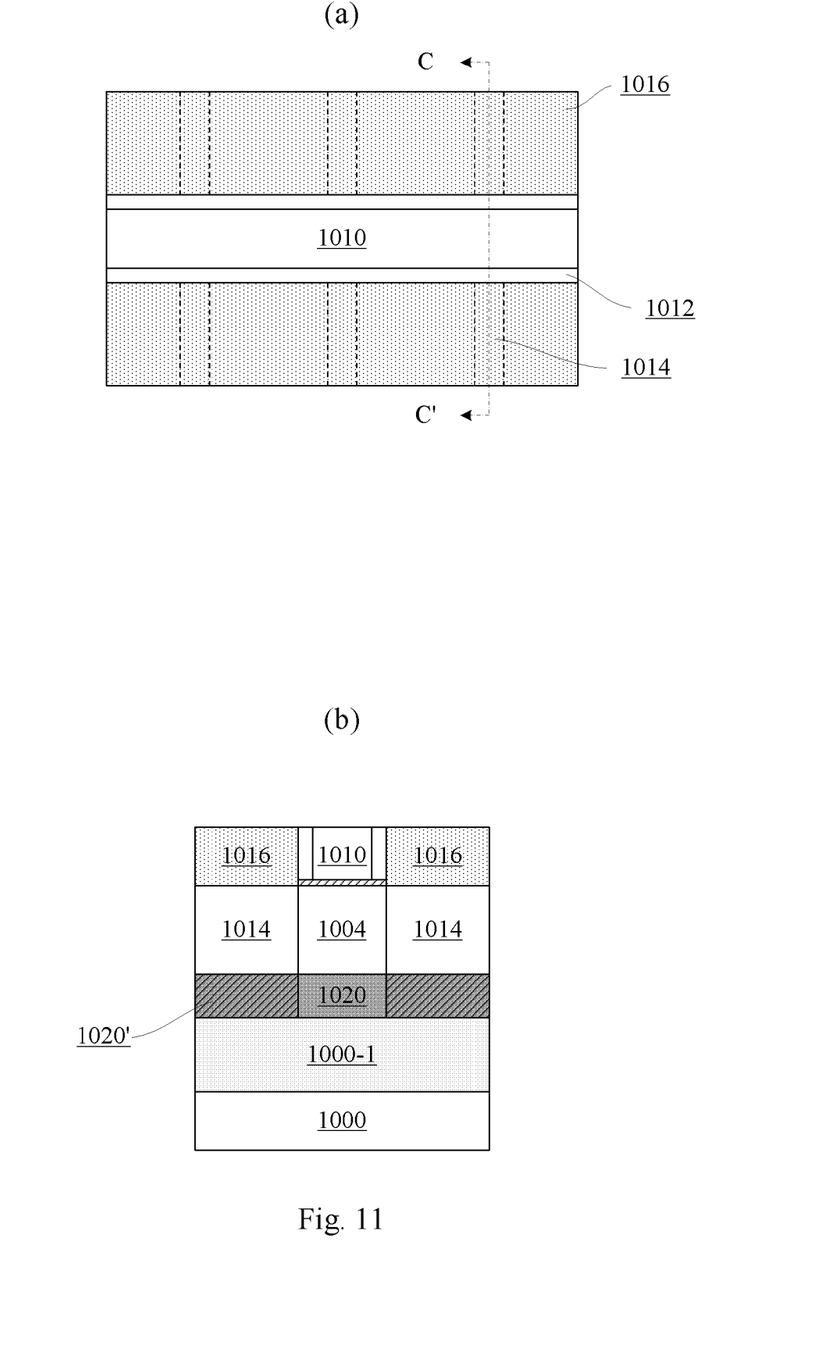

Though the semiconductor layer 1014 is shown in the drawings in a fin-like shape corresponding to the fin structure 1004 (as shown by dotted lines in FIGS. 11(*a*) and 12(*a*), for example), the present disclosure is not limited thereto. For example, the semiconductor layer 1004 may extend laterally to some extent for convenience of making contacts to the source/drain regions.

In a case where the gate conductor layer 1010 comprises polysilicon, the growth of the semiconductor layer 1014 may also occur on the top surface of the gate conductor layer 1010. This is not shown in the drawings.

In the above embodiments, the gate stack are directly formed after the formation of the fins. However, the present disclosure is not limited thereto. For example, the replacement gate process is also applicable here.

According to a further embodiment of the present disclosure, the gate dielectric layer 1008 and the gate conductor layer 1010 formed as shown in FIG. 5 are a sacrificial gate dielectric layer and a sacrificial gate conductor layer, respectively (resulting in a sacrificial gate stack after the processes as described above in conjunction with FIGS. 6 and 7). Next, the PTS may be compensated for in the same way as described above in conjunction with FIG. 8. Further, the strained source/drain technology may also be applied as described above in conjunction with FIGS. 9 and 10.

Next, the sacrificial gate stack may be processed by a replacement gate process, to form a real gate stack for the device. For example, this can be done as follows.

Specifically, as shown in FIG. 11 (FIG. 11(*b*) shows a cross-sectional view along line CC' of FIG. 11(*a*)), a further dielectric layer 1016 may be formed by e.g. deposition. The dielectric layer 1016 may comprise e.g. oxide. Subsequently, the dielectric layer 1016 may be planarized by e.g. CMP. The CMP may be stopped at the gate spacer 1012, so as to expose the sacrificial gate conductor layer 1010.

Figure 12:
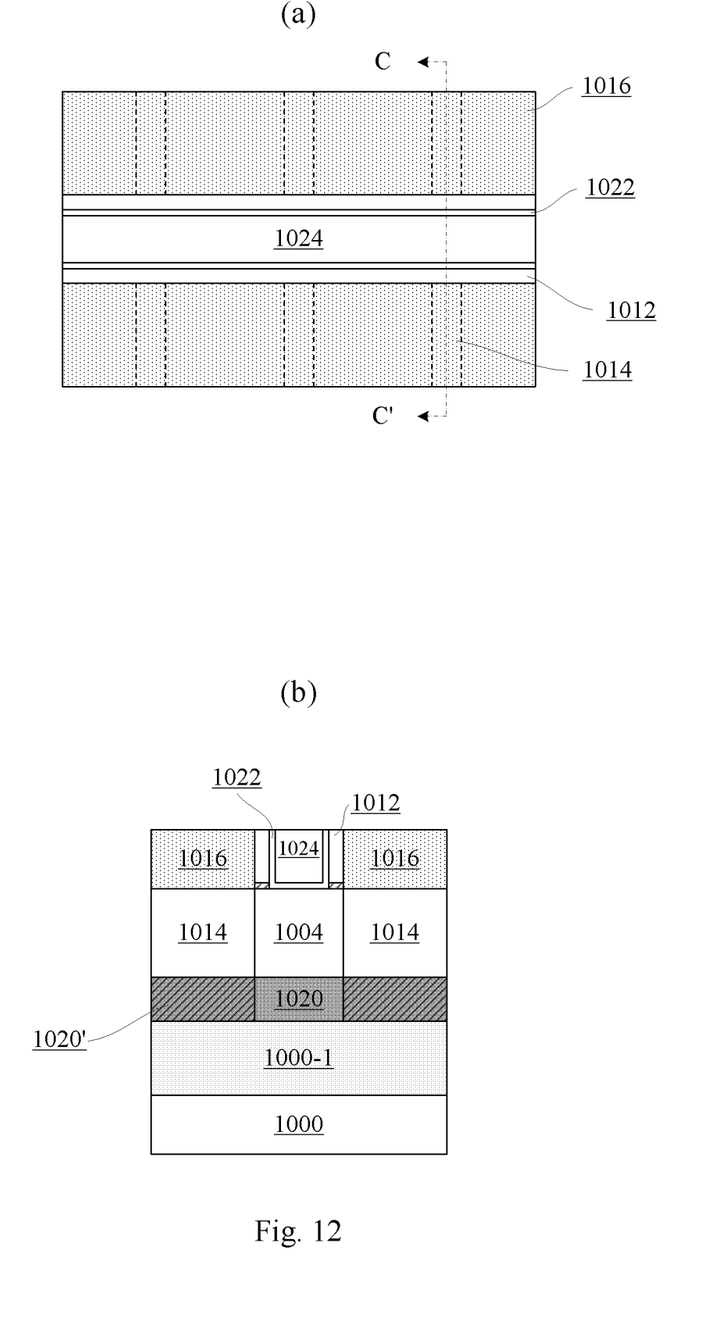

Then, as shown in FIG. 12 (FIG. 12(*b*) shows a cross-sectional view along line BB' of FIG. 12(*a*), and FIG. 12(*c*) shows a cross-sectional view along line CC' of FIG. 12(*a*)), the sacrificial gate conductor 1010 may be selectively removed by e.g. TMAH solution, so as to form a gate trench on inner sides of the gate spacer 1012. According to a further embodiment, the sacrificial gate dielectric layer 1008 may be further removed. Then, a gate dielectric layer 1022 and a gate conductor layer 1024 may be formed in the gate trench, so as to form a final gate stack. The gate dielectric layer 1022 may comprise a high-K gate dielectric, e.g. $HfO_2$, with a thickness of about 1-5 nm. The gate conductor layer 1024 may comprise a metal gate conductor. Preferably, a work function adjustment layer (not shown) may also be formed between the gate dielectric layer 1022 and the gate conductor layer 1024.

Thus, the semiconductor device according to the embodiment is achieved. As shown in FIG. 12, the semiconductor device may comprise the fin 1004 formed on the substrate 1000 and the gate stack intersecting the fin 1004. In this embodiment, the gate stack may comprise the gate dielectric layer 1022 and the gate conductor layer 1024 (and also the gate spacer 1012), and is separated from the substrate by the isolation layer 1006. The semiconductor device may further comprise the PTS formed under the fin. The PTS comprises the section 1020 whose doping concentration is relatively high, which is self-aligned to and directly under the channel region (corresponding to a portion of the fin 1004 where the fin 1004 intersects the gate stack), and also the sections 1020' whose doping concentration is relatively lower, which are self-aligned to and directly under the source/drain regions (corresponding to portions of the fin 1004 on opposite sides of the channel region), respectively. For example, the PTS may include p-type dopants such as B, $BF_2$ or In for an n-type device, or n-type dopants such as As or P for a p-type device.

The substrate 1000 may have the well 1000-1 formed therein. The doping concentration of the section 1020 self-aligned to and directly under the channel region is higher than that of the well 1000-1.

Further, in the case where the strained source/drain technology is applied, the portion of the fin structure 1004 exposed by the isolation layer 1006 (that is, the above described "fin") is positioned under the gate stack, and opposite sidewalls of the fin have the semiconductor layer 1014 formed thereon where the source/drains are formed. The semiconductor layer 1014 may be formed in a fin-like shape.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

What is claimed is:
1. A semiconductor device comprising:
   a fin formed on a substrate;
   a gate stack formed on the substrate and intersecting the fin, wherein the gate stack is isolated from the substrate by an isolation layer, and
   a Punch-Through Stopper (PTS) formed under the fin, including a first doped section directly under a portion of the fin where the fin intersects the gate stack and second doped sections on opposite sides of the first section, wherein the second sections each have a doping concentration lower than that of the first section.

2. The semiconductor device according to claim 1, wherein the fin is positioned under the gate stack, and the semiconductor device further comprises a semiconductor layer formed on opposite sidewalls of the fin, wherein source/drain regions for the semiconductor device are formed in the semiconductor layer.

3. The semiconductor device according to claim 2, wherein the semiconductor layer is compressive-stressed for a p-type device, or tensile-stressed for an n-type device.

4. The semiconductor device according to claim 3, wherein the substrate comprises Si, the fin is continuous with the substrate, and the semiconductor layer comprises SiGe or Si:C.

5. The semiconductor device according to claim 2, wherein the first section of the PTS is self-aligned to the gate stack, and the second sections of the PTS is self-aligned to the source and drain regions, respectively.

6. The semiconductor device according to claim 1, wherein the doping concentration of the first section of the PTS is about $5E17\text{-}2E19\ cm^{-3}$, and the doping concentration of the second sections of the PTS is about $5E16\text{-}1E19\ cm^{-3}$.

\* \* \* \* \*